(12) United States Patent
Lee et al.

(10) Patent No.: US 8,847,485 B2
(45) Date of Patent: Sep. 30, 2014

(54) DISPLAY DEVICE, MANUFACTURING METHOD OF THE DISPLAY DEVICE, ORGANIC LIGHT EMITTING DIODE DISPLAY

(75) Inventors: Choong-Ho Lee, Yongin (KR); Jung-Min Lee, Yongin (KR); Kie-Hyun Nam, Yongin (KR)

(73) Assignee: Samsung Display Co., Ltd. (KR)

( * ) Notice: Subject to any disclaimer, the term of this patent is extended or adjusted under 35 U.S.C. 154(b) by 539 days.

(21) Appl. No.: 13/077,100

(22) Filed: Mar. 31, 2011

(65) Prior Publication Data

US 2012/0104937 A1    May 3, 2012

(30) Foreign Application Priority Data

Oct. 28, 2010    (KR) .................. 10-2010-0106069

(51) Int. Cl.
  *H01J 1/62*    (2006.01)
  *H01L 51/52*    (2006.01)
(52) U.S. Cl.
  CPC .................... *H01L 51/524* (2013.01)
  USPC ........................... 313/512; 313/504
(58) Field of Classification Search
  USPC .......................... 313/504, 512, 503
  See application file for complete search history.

(56) References Cited

U.S. PATENT DOCUMENTS

| | | | |
|---|---|---|---|
| 6,998,776 B2 | 2/2006 | Aitken et al. | |
| 7,537,504 B2 | 5/2009 | Becken et al. | |
| 8,198,796 B2 * | 6/2012 | Takada | 313/352 |
| 2007/0096631 A1 * | 5/2007 | Sung et al. | 313/498 |
| 2007/0212525 A1 * | 9/2007 | Sung et al. | 428/192 |
| 2010/0013372 A1 * | 1/2010 | Oikawa et al. | 313/498 |
| 2010/0075564 A1 * | 3/2010 | Kim | 445/25 |

FOREIGN PATENT DOCUMENTS

JP    09-189914 A    7/1997
KR    10-0634887 B1    10/2006

OTHER PUBLICATIONS

JP2000-143262.*

* cited by examiner

*Primary Examiner* — Nimeshkumar Patel
*Assistant Examiner* — Jacob R Stern
(74) *Attorney, Agent, or Firm* — Knobbe Martens Olson & Bear LLP

(57) ABSTRACT

A method of manufacturing a display device includes: forming a display unit on a substrate; disposing a bonding layer including thermosetting resin and surrounding the display unit, on the substrate; forming a sealing substrate including a composite member and a metal layer disposed on one side of the composite member, the composite member including a resin matrix and a plurality of carbon fibers; disposing the sealing substrate on the bonding layer such that the metal layer faces the display unit; and bonding the substrate with the sealing substrate by hardening the bonding layer, connecting a power source to the plurality of carbon fibers to use the composite member as a heating body.

20 Claims, 16 Drawing Sheets

DISPLAY DEVICE, MANUFACTURING METHOD OF THE DISPLAY DEVICE, ORGANIC LIGHT EMITTING DIODE DISPLAY

CROSS-REFERENCE TO RELATED APPLICATIONS

This application claims priority to and the benefit of Korean Patent Application No. 10-2010-0106069 filed in the Korean Intellectual Property Office on Oct. 28, 2010, the entire contents of which are incorporated herein by reference.

BACKGROUND

1. Field

The described technology relates generally to a display device and an organic light emitting diode display. Further, the described technology relates generally to the structure of a sealing substrate that seals a display unit and a method of sealing the display unit.

2. Description of the Related Technology

Flat plate and self light emitting organic light emitting diode (OLED) displays have been proposed in display devices.

Organic light emitting diode displays include an organic light emitting diode, emit light by themselves, and display images. Display units including a plurality of organic light emitting diodes decrease in function when being exposed to water and oxygen, such that a technology for preventing external water and oxygen from permeating by sealing the display units has been required.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide a display device, an organic light emitting diode display, and a manufacturing method of the display device having advantages of improving sealability.

According to one aspect, a method of manufacturing a display device, includes: forming a display unit on a substrate, disposing a bonding layer including thermosetting resin and surrounding the display unit, on the substrate, forming a sealing substrate including a composite member and a metal layer disposed on one side of the composite member, the composite member including a resin matrix and a plurality of carbon fibers, disposing the sealing substrate on the bonding layer such that the metal layer faces the display unit, and bonding the substrate with the sealing substrate by hardening the bonding layer, connecting a power source to the plurality of carbon fibers to use the composite member as a heating body.

A terminal exposing the ends of the carbon fibers may be formed at an end in at least one direction of the composite member. The terminal may be an inclining surface formed by cutting off at an angle at least one of a surface of the composite member which faces the metal layer and the opposite surface.

The composite member may be formed by providing a plurality of carbon fiber prepregs, forming the terminal at least one of the prepregs, and stacking and plastic-working the plurality of carbon fiber prepregs.

A connection electrode may be fitted to the terminal such that the carbon fibers contact with the connection electrode, when the power source is connected to the carbon fibers, and at least one of DC and AC electricity is supplied to the carbon fibers through the connection electrode. The connection electrode may be made of ductile metal and may have a press type structure that presses the terminal.

A first press plate and a second press plate may be disposed outside the substrate and the sealing substrate, respectively, when the bonding layer is hardened, and the first press plate and the second press plate press the substrate and the sealing substrate. A heat insulator may be disposed on one side of the first press plate which faces the substrate and one side of the second press plate which faces the sealing substrate.

Heat may be applied to the substrate and pressure may be applied to the sealing substrate by disposing a press plate and a heat insulator outside the sealing substrate and disposing a heating plate outside the substrate, when hardening the bonding layer.

According to another aspect, a display device includes: a substrate, a display unit formed on the substrate, a bonding layer disposed outside the display unit and including thermosetting resin, and a sealing substrate fixed to the substrate by the bonding layer. The sealing substrate includes: a composite member including a resin matrix and a plurality of carbon fibers, a terminal formed at an end in at least one direction of the composite member and exposing the ends of the carbon fibers, and a metal layer disposed on a side of the composite member which faces the display unit.

The composite member may be composed of a plurality of layers and each of the plurality of layers may include a resin matrix and a plurality of carbon fibers arranged in one direction. The carbon fibers disposed on any one of the plurality of layers may intersect the carbon fibers disposed on another layer.

The composite member may include first to fourth composite layers, the carbon fibers in the first and fourth composite layers may be arranged in a first direction, and the carbon fibers in the second and third composite layers may be arranged in a second direction perpendicular to the first direction.

The terminal may be formed at both ends of the first composite layer in the first direction. The terminal may alternatively be formed at both ends of the first composite layer in the first direction and at both ends of the fourth composite layer in the first direction.

Alternatively, the terminal may be formed at both ends of the first composite layer in the first direction, at both ends of the second composite layer in the second direction, at both ends of the third composite layer in the second direction, and at both ends of the fourth composite layer in the first direction.

The terminal may be an inclining surface formed by cutting off at an angle at least one of a side of a corresponding composite layer which faces the substrate and the opposite side. The display device may further include a hygroscopic filler positioned between the substrate and the sealing substrate, inside the bonding layer, and a getter disposed inside the bonding layer.

According to another aspect, an organic light emitting diode display includes: a substrate, a display unit formed on the substrate and including a common power line and a common electrode, a bonding layer disposed outside the display unit and including thermosetting resin, a sealing substrate fixed to the substrate by the bonding layer, and including a composite member which includes a resin matrix and a plurality of carbon fibers, and an insulating member that is coupled to the edge of the composite member and has a first penetration hole and a second penetration hole, a first conductive part formed throughout the inner side and the outer side of the sealing substrate through the first penetration hole and supplying a first electric signal to the common power line; and a second conductive part formed throughout the inner side and the outer side of the sealing substrate through the second penetration hole and supplying a second electric signal to the common electrode. The composite member may have a terminal exposing the ends of the carbon fibers, at one end in at least one direction.

The common power line may be connected with a first pad outside the display unit and the common electrode may be connected with a second pad outside the display unit. A conductive bonding layer may be positioned between the first pad and the first conductive part and between the second pad and the second conductive part. The conductive bonding layer may be positioned at a predetermined distance from the bonding layer, may include thermosetting resin, and may be nonconductive in directions other than the thickness direction.

The first conductive part may include: a first inner layer disposed on the inner side of the insulating member, in contact with the conductive bonding layer, a first outer layer disposed on the outer side of the insulating member, and a first connection part inserted in the first penetration hole and connecting the first inner layer with the first outer layer.

The second conductive part may include: a second inner layer disposed across the inner side of the composite member and the inner side of the insulating member, in contact with the conductive bonding layer, a second outer layer disposed on the outer side of the insulating member, and a second connection part inserted in the second penetration hole and connecting the second inner layer with the second outer layer. The first inner layer and the second inner layer may be separated from each other by an interval, and the first outer layer and the second outer layer may be separated each other by an interval.

The composite member may include first to fourth composite layers, the carbon fibers in the first and fourth composite layers may be arranged in a first direction, and the carbon fibers in the second and third composite layers may be arranged in a second direction perpendicular to the first direction. The terminal may be formed at both ends of any one of the first to fourth composite layers.

The sealing substrate may further include a conductive member. The conductive member may include a contact part fixed to the terminal, in contact with the ends of the carbon fibers, and an extending part passing through the insulating member and exposed outside the insulating member.

The insulating member may include first to fourth insulating layers and each of the first to fourth insulating layer may be made of any one of polymer resin and a reinforced fiber composite material, and the extending part may pass through between two adjacent insulating layers in the first to fourth insulating layers, and may be exposed outside the insulating member.

According to exemplary embodiments, an external device, such as a heating plate or a hot chamber, for hardening the thermosetting bonding layer is not needed and a pressure controller can be easily applied. Therefore, it is possible to efficiently bond the substrate with the sealing substrate by hardening the bonding layer, using simple equipment and a simple method. Further, there is a reduced need to add a heating part, because the composite member in the display device is used as a heating body, such that it is possible to simplify the structure of the display device and reduce the manufacturing cost.

DETAILED DESCRIPTION OF CERTAIN INVENTIVE EMBODIMENTS

Figure 1:
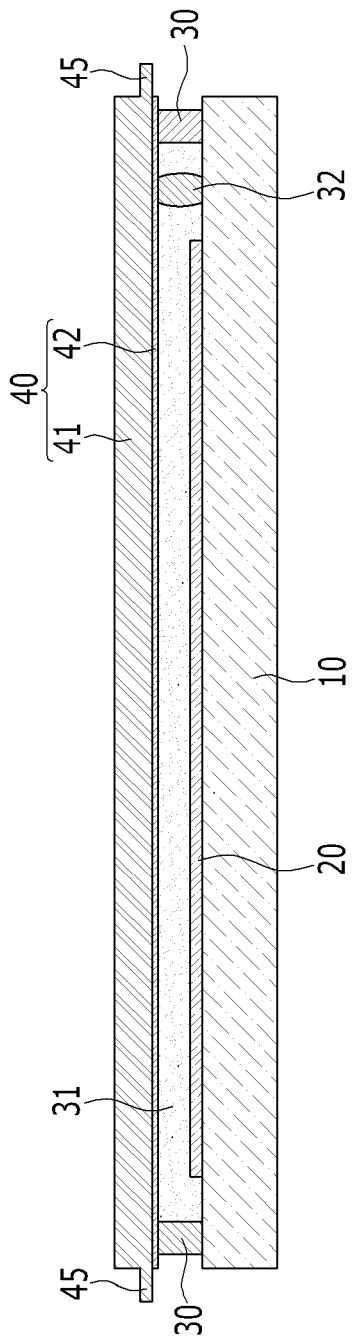
FIG. 1 is a schematic cross-sectional view of an embodiment of a display device.

The present invention will be described more fully hereinafter with reference to the accompanying drawings, in which exemplary embodiments of the invention are shown. As those skilled in the art would realize, the described embodiments may be modified in various ways, without departing from the spirit or scope of the present invention.

The drawings and description are to be regarded as illustrative in nature and not restrictive. Like reference numerals generally designate like elements throughout the specification. The size and thickness of the components shown in the drawings are optionally determined for better understanding and ease of description, and the present invention is not limited to the examples shown in the drawings.

It will be understood that when an element such as a layer, film, region, or substrate is referred to as being "on" another element, it can be directly on the other element or intervening elements may also be present. Further, in the specification and the claims that follow, when it is described that an element is "coupled" to another element, the element may be "directly coupled" to the other element or "electrically coupled" to the other element through a third element.

FIG. 1 is a schematic cross-sectional view of an embodiment of a display device.

Referring to FIG. 1, a display device 100 includes a substrate 10, a display unit 20 formed on the substrate 10, a bonding layer 30 surrounding the display unit 20 on the substrate 10, and a sealing substrate 40 fixed to the substrate 10 by the bonding layer 30. The sealing substrate 40 is composed of a composite member 41 including a resin matrix and a plurality of carbon fibers, and a metal layer 42 disposed on the side of the composite member 41 which faces the display unit 20. The composite member 41 includes a terminal 45 at an end in at least one direction.

The display unit 20 includes a plurality of pixels and displays predetermined images. In embodiments where the display device 100 is an organic light emitting diode display, an organic light emitting diode and a driving circuit unit are positioned in each of the pixels. FIG. 1 schematically shows the display unit 20 as one layer, for convenience.

The substrate 10 is made of transparent glass or transparent plastic and the light emitted from the display unit 20 is transmitted outside through the substrate 10. Light transmittance is not high because a lot of electric wires are disposed outside the display unit 20 where the bonding layer 30 is disposed, on the substrate 10. Therefore, the bonding layer 30 is made of thermosetting resin, and may include epoxy resin.

A hygroscopic filler 31 is positioned between the substrate 10 and the sealing substrate 40, inside the bonding layer 30, and a getter 32 is positioned between the display unit 20 and the bonding layer 30. The substrate 10 is made of glass or plastic that has a small coefficient of thermal expansion, because it undergoes multiple heat treatment processes for forming the driving circuit unit (not shown) and the organic light emitting diode thereon. The substrate 10 may have a coefficient of thermal expansion of about $3 \times 10^{-6}$/K to about $4 \times 10^{-6}$/K.

The coefficient of thermal expansion of the carbon fiber in the composite member 41 is smaller than the coefficient of thermal expansion of the substrate and the coefficient of thermal expansion of the resin matrix in the composite member 41 is larger than the coefficient of thermal expansion of the substrate. The composite member 41 may be designed to have an overall coefficient of thermal expansion very close to the coefficient of thermal expansion of the substrate 10, by adjusting the content of the carbon fiber and the resin matrix, as would be obvious to a person of ordinary skill in the art.

Therefore, when the substrate 10 and the sealing substrate 10 are bonded by hardening the bonding layer 30 at high temperature, bending due to a difference in coefficients of thermal expansion of the substrate 10, and the sealing substrate 40 does not occur and a problem due to bending does not occur in an environmental reliability test after the bonding.

The metal layer 42 may be formed of an aluminum layer or a copper layer, or of a metal foil containing aluminum or copper.

The metal layer 42 is effective in intercepting external water and oxygen. Accordingly, water and oxygen outside the display device 100 are intercepted by the composite member 41 having a dense structure, also intercepted by the metal layer 42, and additionally intercepted by the hygroscopic filler 31. The sealing substrate 40 composed of the metal layer 42 and the composite member 41 can ensure high air-tightness substantially similar to a glass substrate.

Figure 2:
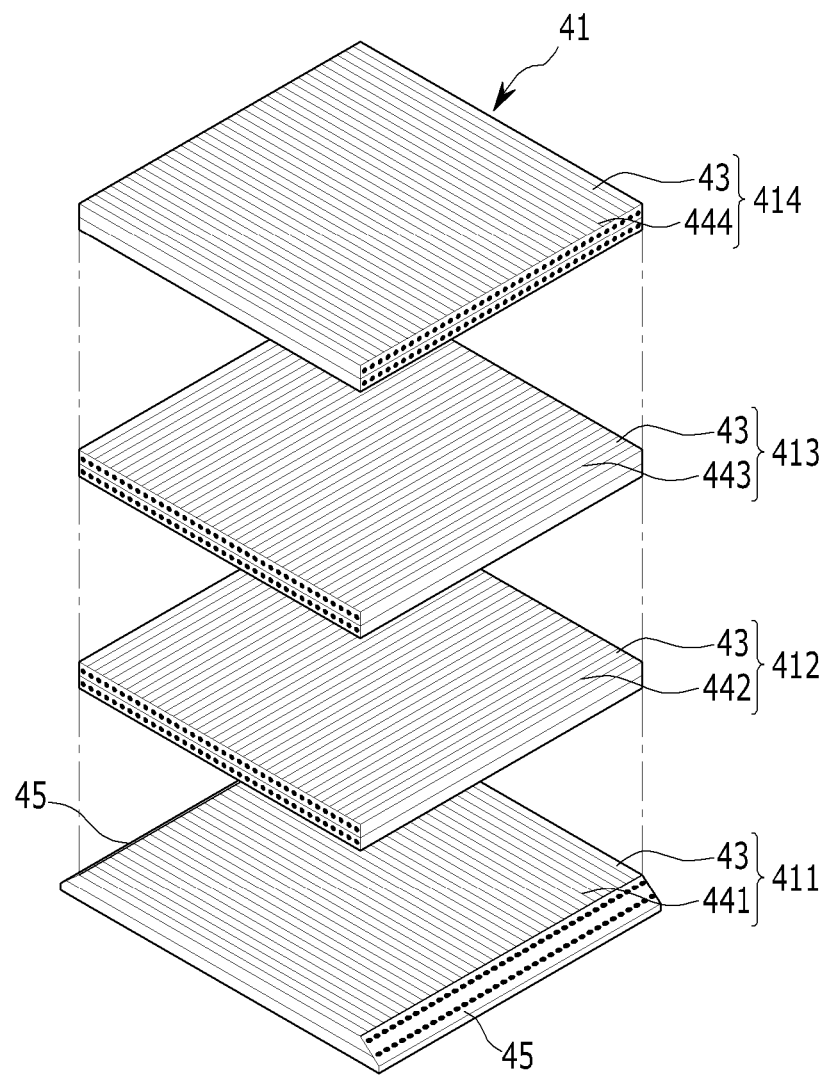
FIG. 2 is an exploded perspective view showing a composite member in the embodiment of a display device shown in FIG. 1.
Figure 3:
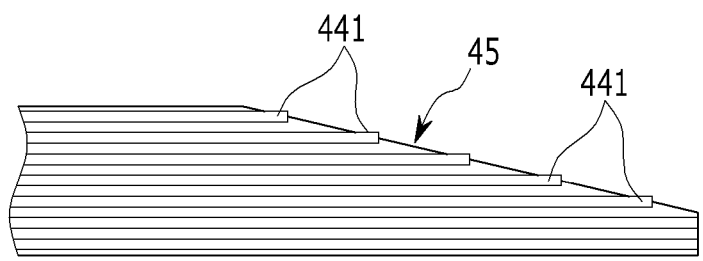
FIG. 3 is a partial enlarged cross-sectional view of FIG. 2.

FIG. 2 is an exploded perspective view showing the composite member in the embodiment of a display device shown in FIG. 1 and FIG. 3 is a partial enlarged cross-sectional view of FIG. 2.

Referring to FIG. 2 and FIG. 3, the composite member 41 has a stacked structure composed of a first composite layer 411, a second composite layer 412, a third composite layer 413, and a fourth composite layer 414, each composite layer including a resin matrix 43 and a carbon fibers 441, 442, 443, and 444, respectively. The carbon fibers 441, 442, 443, and 444 may be embedded in the resin matrix 43.

The carbon fiber 441 of the first composite layer 411 and the carbon fiber 444 of the fourth composite layer 414 are arranged in a first direction while the carbon fiber 442 of the second composite layer 412 and the carbon fiber 443 of the third composite layer 413 are arranged in a second direction. In some embodiments, the first direction and the second direction may be perpendicular to one another, as shown in FIG. 2. In other embodiments, the directions may be non-perpendicular to one another.

The first through fourth composite layers 411-414 are each composed of a resin matrix 43 and carbon fiber prepreg formed by embedding the respective carbon fibers 441, 442, 443, and 444 in epoxy resin. The first though fourth composite layers 411-414 make the single composite layer 41 by the resin matrices 43 that are integrally hardened by plasticity. Since the horizontal thermal expansion rate and the vertical thermal expansion rate of the composite layer 41 become the same by arranging the plurality of carbon fibers 441, 442, 443, and 444 as described above, it is possible to prevent the composite layer 41 from bending.

The composite member 41 has terminals 45 exposing the ends of the carbon fibers. The terminal 45 may be formed at the first composite layer 411 being in contact with the metal layer 42 (see FIG. 1). The first composite layer 411 has a pair of terminals 45 at both ends in the first direction to expose the ends of the carbon fibers 441. The pair of terminals 45 protrude outside the composite layers 412, 413, and 414 without overlapping the respective one of the composite layers 412-414.

The protruding terminals 45 supply electricity to the exposed carbon fibers 441, in contact with connection electrodes, which are described below. The terminals 45 are inclining surfaces that are formed by cutting off both ends of the first composite layer 411 at an angle in the thickness direction (vertical direction in FIG. 3). Therefore, the ends of the exposed carbon fibers 441 are widely distributed at a predetermined distance from each other and can efficiently contact with the connection electrode.

The inclining surface may be formed at a surface of the first composite layer 411 which faces the second through fourth composite layers 412-414, or at the opposite surface. FIG. 2 and FIG. 3 illustrate the first embodiment. In various embodiments, the composite member 41 may be composed more or less than four composite layers.

Referring to FIG. 1 to FIG. 3, the sealing substrate 40 covers and protects the display unit 20 and also functions as a heating body that hardens the bonding layer 30 by heating by itself. The carbon fibers 441 of the composite member 41 receive electricity from the terminals 45 and produce resistant heat such that the composite member 41 functions as a heating body, during manufacturing of the display device 100. Therefore, it is possible to harden the bonding layer 30, the hygroscopic filler 31, and the getter 32, without a separate heating device.

Figure 4:
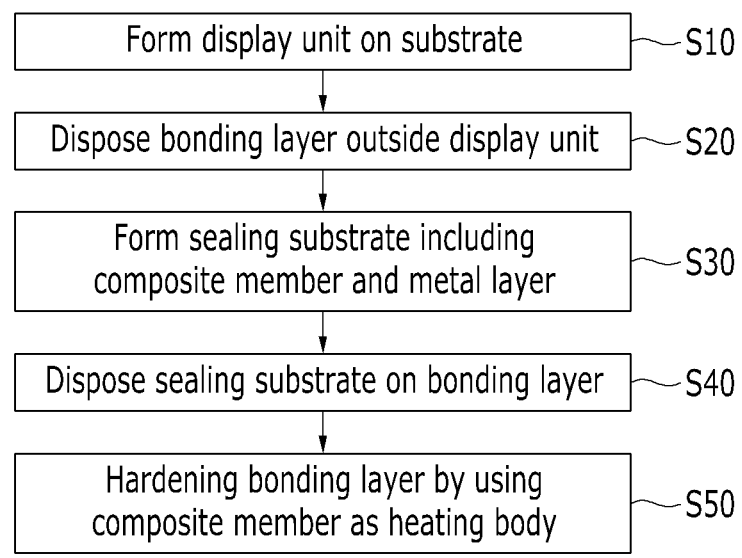
FIG. 4 is a process flowchart illustrating an embodiment of a method of manufacturing the embodiment of a display device shown in FIG. 1.

FIG. 4 is a process flowchart illustrating an embodiment of a method of manufacturing the embodiment of a display device shown in FIG. 1.

Referring to FIG. 4, a method of manufacturing the display device includes forming a display unit on a substrate (S10), disposing a bonding layer including thermosetting resin outside the display unit (S20), manufacturing a sealing substrate composed of a composite member and a metal layer (S30), disposing the sealing substrate on the bonding layer, with the metal layer facing the display unit (S40), and bonding the substrate with the sealing substrate by hardening the bonding layer, using the composite layer as a heating body (S50).

Figure 5:
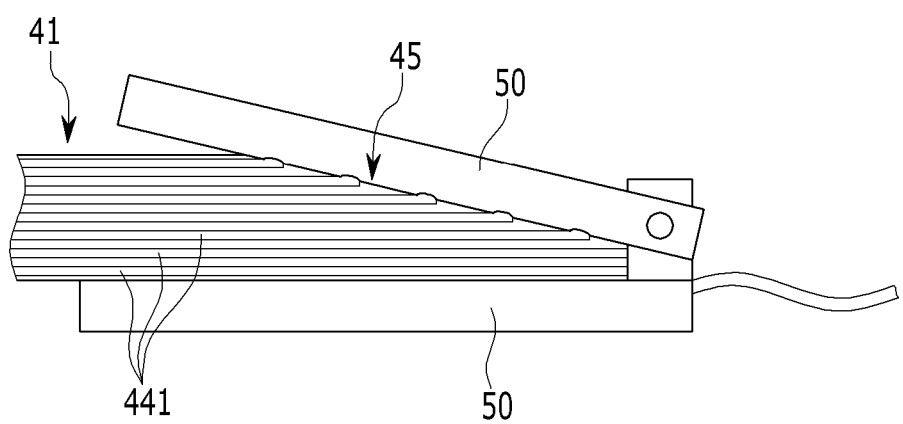
FIG. 5 and FIG. 6 are schematic diagrams showing a step in the embodiment of a method of manufacturing shown in FIG. 4.
Figure 6:
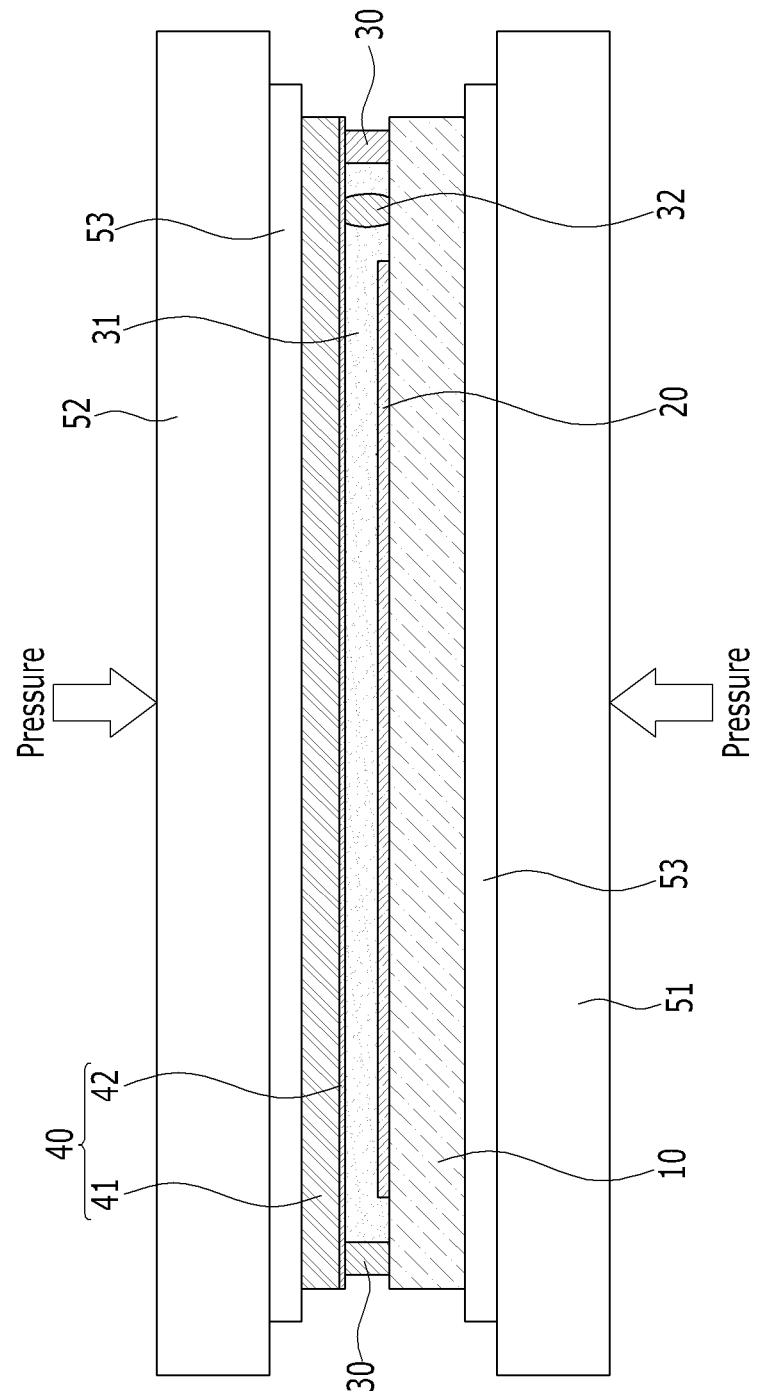

FIG. 5 and FIG. 6 are schematic diagrams showing a step in the embodiment of a method of manufacturing the display device shown in FIG. 4.

Referring to FIG. 5 first, S50 of FIG. 4 includes a process of fitting the terminals 45 formed at the composite member 41 to the connection electrodes 50 to contact the carbon fibers 441 with the connection electrodes 50 such that DC or AC electricity is applied to the carbon fibers 441 through the connection electrodes 50. Accordingly, the composite member 41 is heated by the resistant heat of the carbon fibers 441, and functions as a heating body.

The connection electrodes 50 are made of metal having high ductility, such as copper, and may be formed in a press type structure that presses the terminals 45, using an elastic member, such as a spring. A large number of carbon fibers 441 can contact with the connection electrodes 50 and receive electricity. Although a clip type connection electrode 50 with an elastic member (not shown) is exemplified in FIG. 5, the shape of the connection electrode 50 is not limited to the example shown in FIG. 5 and may be changed in various ways in other embodiments.

It is possible to apply electricity to all the carbon fibers 441 under the same conditions, using the connection electrode 50. In some embodiments, the carbon fibers 441 in the composite member 41 have substantially the same diameter, such that it is possible to produce the same level of heat regardless of the position, and the same level of heating temperature can be achieved throughout the composite member 41 by the same level of heat.

Electrical resistance of some materials that are available to be used for the heating body is shown in the following Table 1.

TABLE 1

| Material | Electrical resistance ($\Omega$cm) |
| --- | --- |
| Carbon fiber | $1.40 \times 10^{-3}$ |
| Chrome | $1.30 \times 10^{-5}$ |
| Titanium | $5.54 \times 10^{-5}$ |
| Molybdenum | $5.69 \times 10^{-6}$ |
| Nickel | $6.40 \times 10^{-6}$ |
| Aluminum | $2.7 \times 10^{-6}$ |
| Copper | $1.7 \times 10^{-6}$ |

The electrical resistance of the carbon fibers in Table 1 is the electrical resistance of a prepreg sheet formed by embedding one-direction carbon fibers in epoxy resin. The electrical resistance of the carbon fibers embedded in the epoxy resin is higher than the electrical resistance of titanium and molybdenum, such that it has excellent characteristics as a heating body. The resin matrix in the composite member is set to have hardening temperature higher than the hardening temperature (about 100° C.) of the bonding layer, such that it keeps stable at the hardening temperature of the bonding layer.

Referring to FIG. 6, it is possible to press the substrate 10 and the sealing substrate 40, when hardening the bonding layer 30 by using the composite member 41 as a heating body. For this process, an assembly of the substrate 10 and the sealing substrate 40 is disposed between a first press plate 51 and a second press plate 52 while the substrate 10 and the sealing substrate 40 are pressed by the first press plate 51 and the second press plate 52 when the bonding layer 30 is hardened. Thus, the bonding layer 30, the hygroscopic filler 31, and the getter 32 can be more firmly hardened, such that the bonding force between the substrate 10 and the sealing substrate 40 can be increased.

In this process, it may be possible to dispose a heat insulator 53 on one side of the first press plate 51 which is in contact with the substrate 10 and on one side of the second press plate 52 which is in contact with the composite member 41, in order to prevent the heat from the composite member 41 from dissipating to the first press plate 51 and the second press plate 52.

In general, a device, such as a heating plate or a hot chamber, is required to harden the thermosetting bonding layer 30. Since it takes the bonding layer 30 a long time to harden, a large number of heating plates or a hot chamber having a large volume is required to produce the display device 100 in a great quantity.

A pressure controller that maintains the contact pressure of the heating plate and the sealing substrate 40 at a constant level is required to keep the temperature of the heating plate. The hot chamber is also typically equipped with a pressure controller, in which the configuration of the equipment becomes very complicated when the pressure controller is added in the chamber.

However, according to embodiments of the display device 100 and a method of manufacturing the display device, an external device, such as a heating plate and a hot chamber, is not needed and there is requirement of applying a pressure controller. Therefore, it is possible to efficiently bond the substrate 10 and the sealing substrate 40, using simple equipment and method. Further, by using the composite member 41, a part of the display device 100, as a heating body, it is possible to simplify the structure of the display device 100 and decrease the manufacturing cost by eliminating the need for a separate heating unit.

Figure 7:
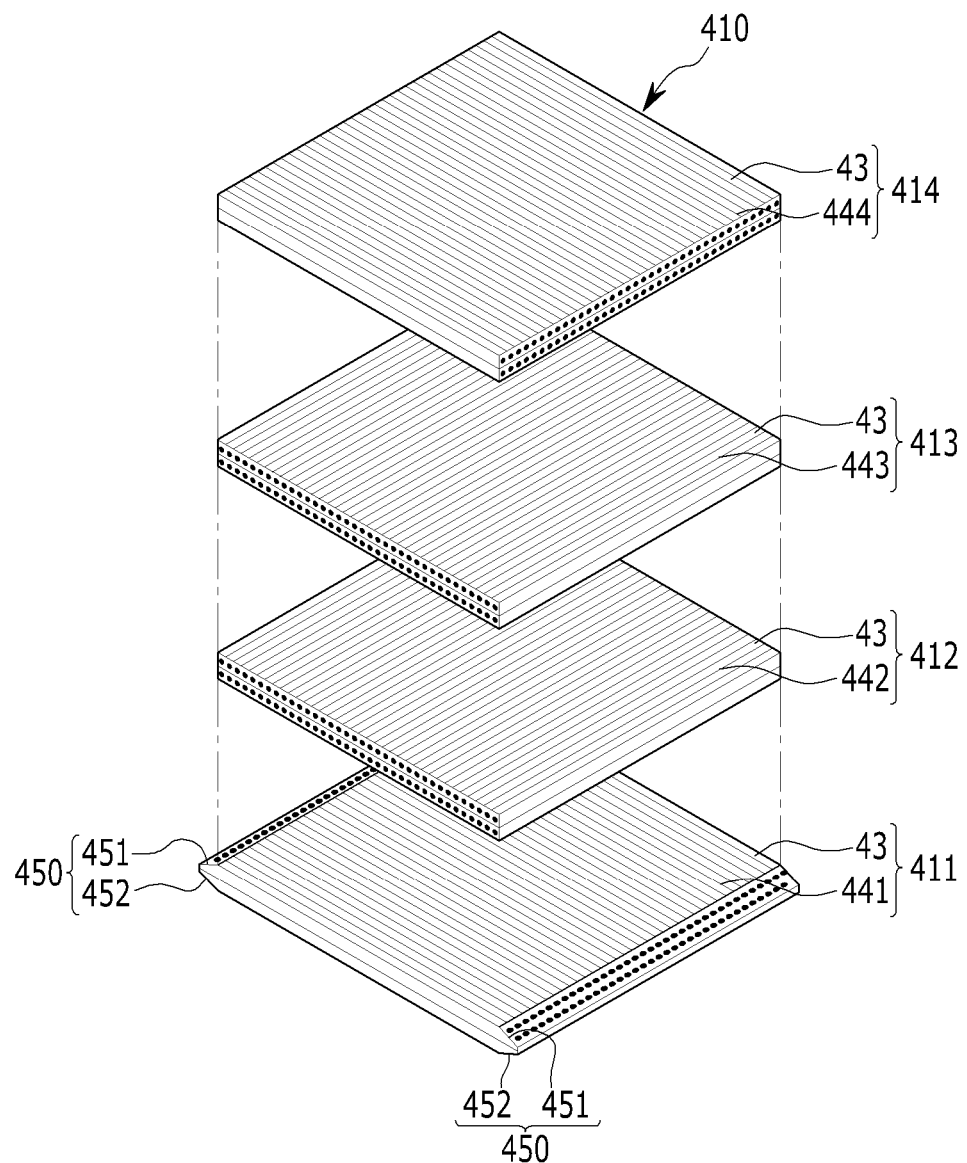
FIG. 7 is an exploded perspective view showing a composite member in another embodiment of a display device.
Figure 8:
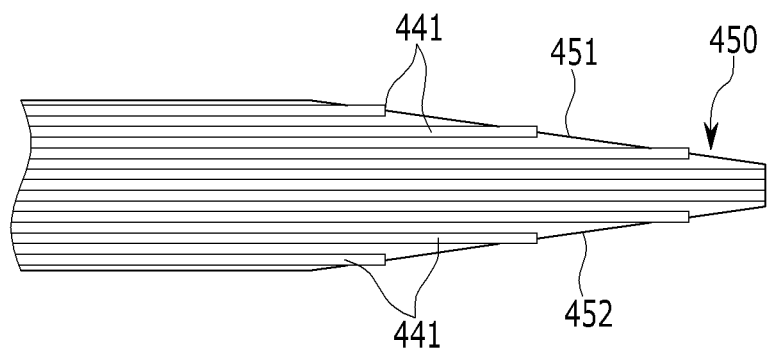
FIG. 8 is a partial enlarged cross-sectional view of FIG. 7.

FIG. 7 is an exploded perspective view showing a composite member in another embodiment of a display device and FIG. 8 is a partial enlarged cross-sectional view of FIG. 7.

Referring to FIG. 7 and FIG. 8, another embodiment of a display device has terminals 450 of a composite member 410 including two inclining surface 451 and 452. The same components as in the first embodiment are referred to with the same reference numerals.

A terminal 450 formed at a first composite layer 441 is composed of a first inclining surface 451 formed at one side facing second through fourth composite layers 412-414 and a second inclining surface 452 formed at the opposite side, facing the substrate 10 (see FIG. 1). The first inclining surface 451 and the second inclining surface 452 are formed by cutting off both ends of the first composite layer 411 at an angle in the thickness direction (vertical direction in the drawing).

Therefore, the carbon fibers 441 of the first composite layer 411 are exposed up and down, in two directions, at the ends, in the figures, and the exposed ends of the carbon fibers 441 are widely distributed at a predetermined distance from each other at the first inclining surface 451 and the second inclining surface 452, such that they can efficiently contact with connection electrodes.

Figure 9:
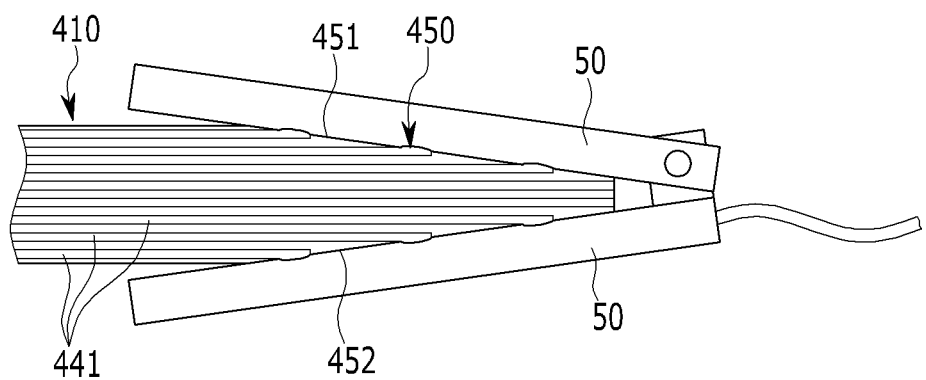
FIG. 9 is a schematic diagram showing a connection electrode coupled to a terminal of the composite member shown in FIG. 8.

FIG. 9 is a schematic diagram showing a connection electrode coupled to a terminal of the embodiment of a composite member shown in FIG. 8.

Referring to FIG. 9, the connection electrodes 50 are in contact with the ends of the exposed carbon fibers 441 connected to the terminals 450 while pressing the first inclining surface 451 and the second inclining surface 452 of the terminals 450, and apply DC or AC electricity to the carbon fibers 441. Accordingly, the composite member 410 is heated by the resistant heat of the carbon fibers 441 and functions as a heating body.

Figure 10:
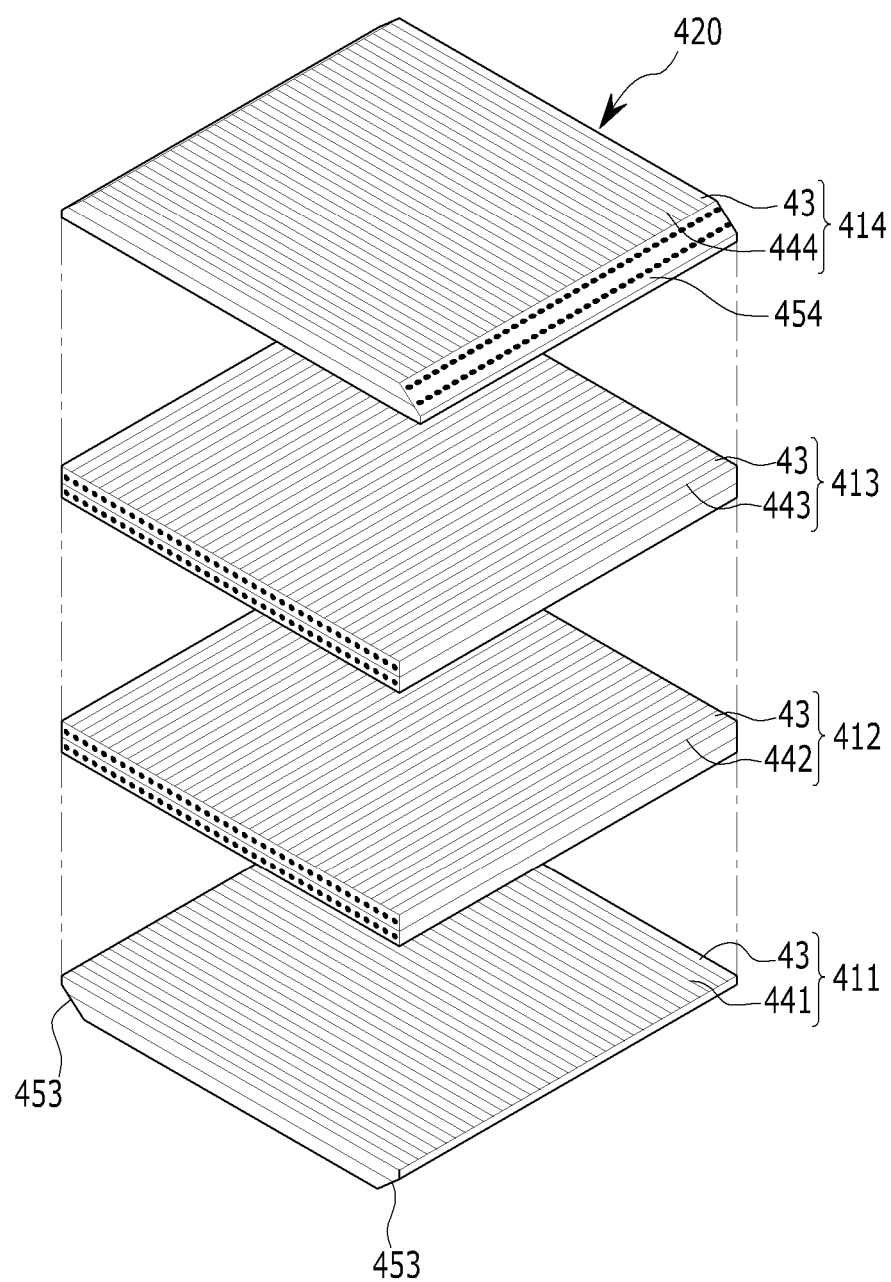
FIG. 10 is an exploded perspective view showing a sealing substrate in another embodiment of a display device.

FIG. 10 is an exploded perspective view showing a sealing substrate in another embodiment of a display device.

Referring to FIG. 10, the display device has terminals formed at the first composite layer 411 and at the fourth composite layer 414 of a composite member 420. The same components as in the other embodiment are referred to with the same reference numerals.

The first composite layer 411 is in contact with the metal layer 42 (see FIG. 1). The first composite layer 411 has a pair of first terminals 453 formed at both ends in a first direction and the fourth composite layer 414 has a pair of second terminals 454 formed at both ends in the first direction. Inclining surfaces of the first terminal 453 may be positioned toward the metal layer 42 and inclining surfaces of the second terminal 454 may be positioned opposite to the metal layer 42.

The lengths of the second composite layer 412 and the third composite layer 413 in the first direction may be the same as the length of the first composite layer 411 and the fourth composite layer 414 in the first direction. The lengths of the first composite layer 411 and the fourth composite layer 414 in the first direction respectively include the length the first terminals 453 and the length of the second terminals 454.

The carbon fibers 441 of the first composite layer 411 and the carbon fibers 444 of the fourth composite layer 414 are arranged in the same direction, such that the flow directions of electricity in the first composite layer 411 and the fourth composite layer 414 are the same. In this embodiment, since electricity is applied to the carbon fibers 441 of the first composite layer 411 and the carbon fibers 444 of the fourth composite layer 414, the top and the bottom of the composite member 420 can be uniformly heated.

Figure 11:
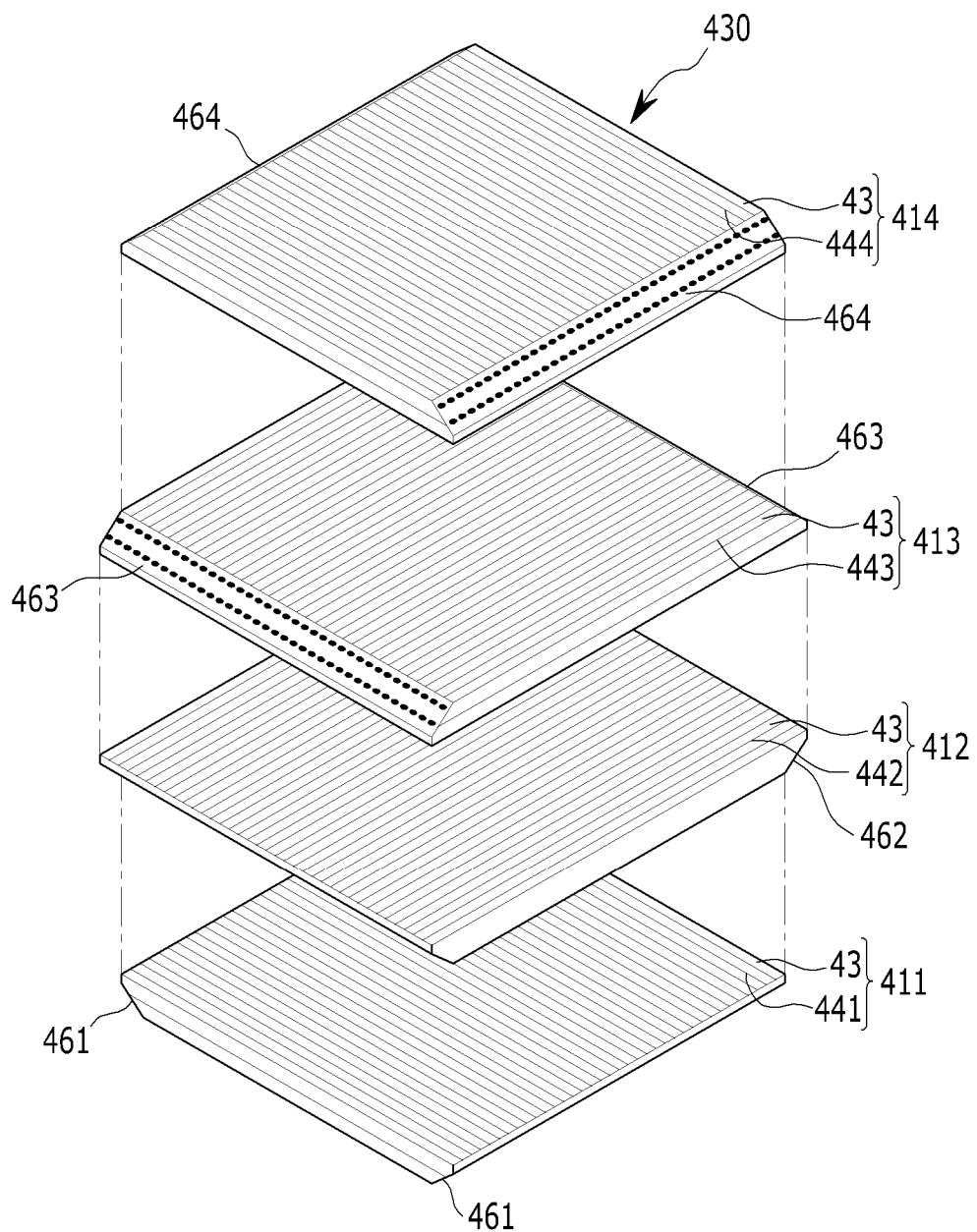
FIG. 11 is an exploded perspective view showing a sealing substrate in another embodiment of a display device.

FIG. 11 is an exploded perspective view showing a sealing substrate in another embodiment of a display device.

Referring to FIG. 11, the display device has terminals 461-464 formed at all of the composite layers 411-414 of a composite member 430. The same components as in the other embodiments are referred to with the same reference numerals.

The first composite layer 411 is in contact with the metal layer 42 (see FIG. 1). The first composite layer 411 has a pair of first terminals 461 formed at both ends in a first direction and the second composite layer 412 has a pair of second terminals 462 formed at both ends in a second direction. The third composite layer 413 has a pair of third terminals 463 formed at both ends in the second direction and the fourth composite layer 414 has a pair of fourth terminals 464 formed at both ends in the first direction.

Inclining surfaces of the first terminals 461 and inclining surfaces of the second terminals 462 may be positioned toward the metal layer 42 while inclining surfaces of the third terminals 463 and the fourth terminals 464 may be positioned opposite to the metal layer 42. The flow directions of electricity in the first composite layer 411 and the fourth composite layer 414 are the same and the flow directions of electricity in the second composite layer 412 and the third composite layer 413 are the same. In some embodiments, the flow directions of electricity in the first and fourth composite layers 411 and 414 may be perpendicular to the flow directions of electricity in the second and third composite layers 412 and 413.

In this embodiment, since electricity is applied to all the carbon fibers 441, 442, 443, and 444 of the first composite layer 411 to the fourth composite layer 414, all of the top, the middle and the bottom portions of the composite member 430 can be uniformly heated.

Figure 12:
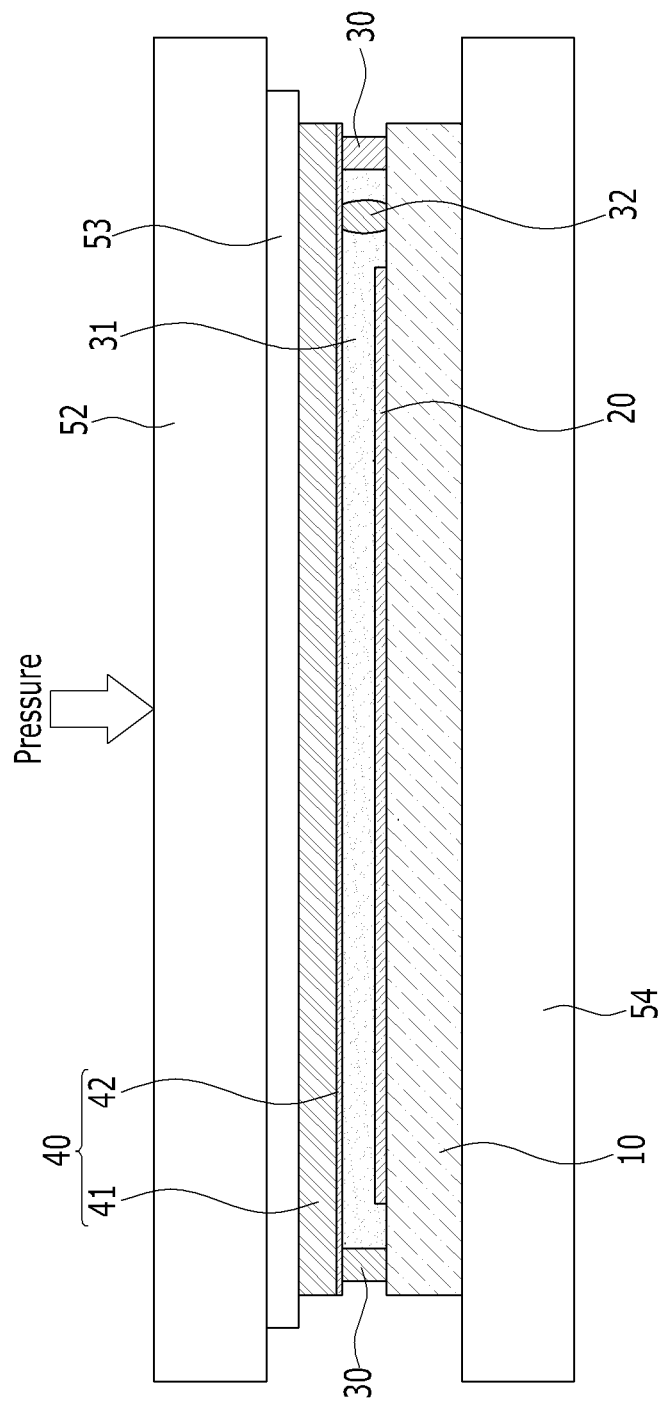
FIG. 12 is a schematic view showing an embodiment of a method of manufacturing a display device.

FIG. 12 is a schematic diagram illustrating another embodiment of a method of manufacturing another embodiment of a display device.

Referring to FIG. 12, a press plate 52 and a heat insulator 53 are disposed outside a sealing substrate 40 and a heating plate 54 may be disposed, instead of the press plate and the heat insulator, outside a substrate, when a boding layer 30 is hardened by a composite member 41, which is used as a heating body. It is possible to reduce the time taken to harden the bonding layer 30 by accelerating the increase of temperature of the substrate 10.

Figure 13:
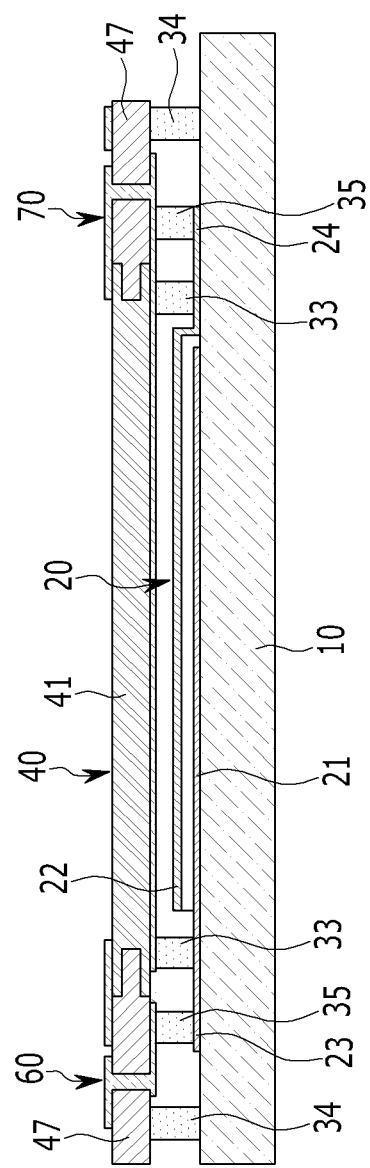
FIG. 13 is a cross-sectional view schematically showing an embodiment of an organic light emitting diode display.
Figure 14:
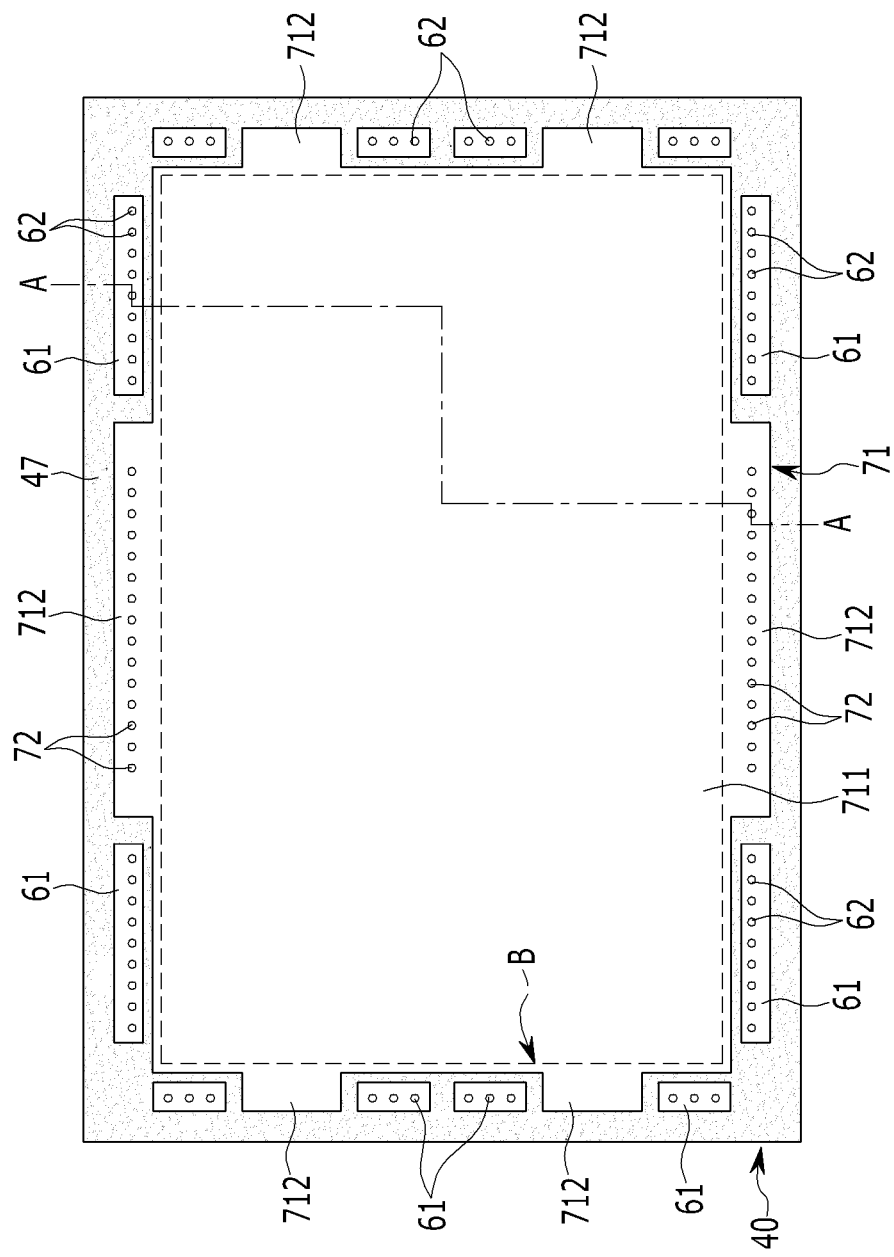
FIG. 14 is a top plan view showing the inner side of a sealing substrate in the embodiment of an organic light emitting diode display shown in FIG. 13.
Figure 15:
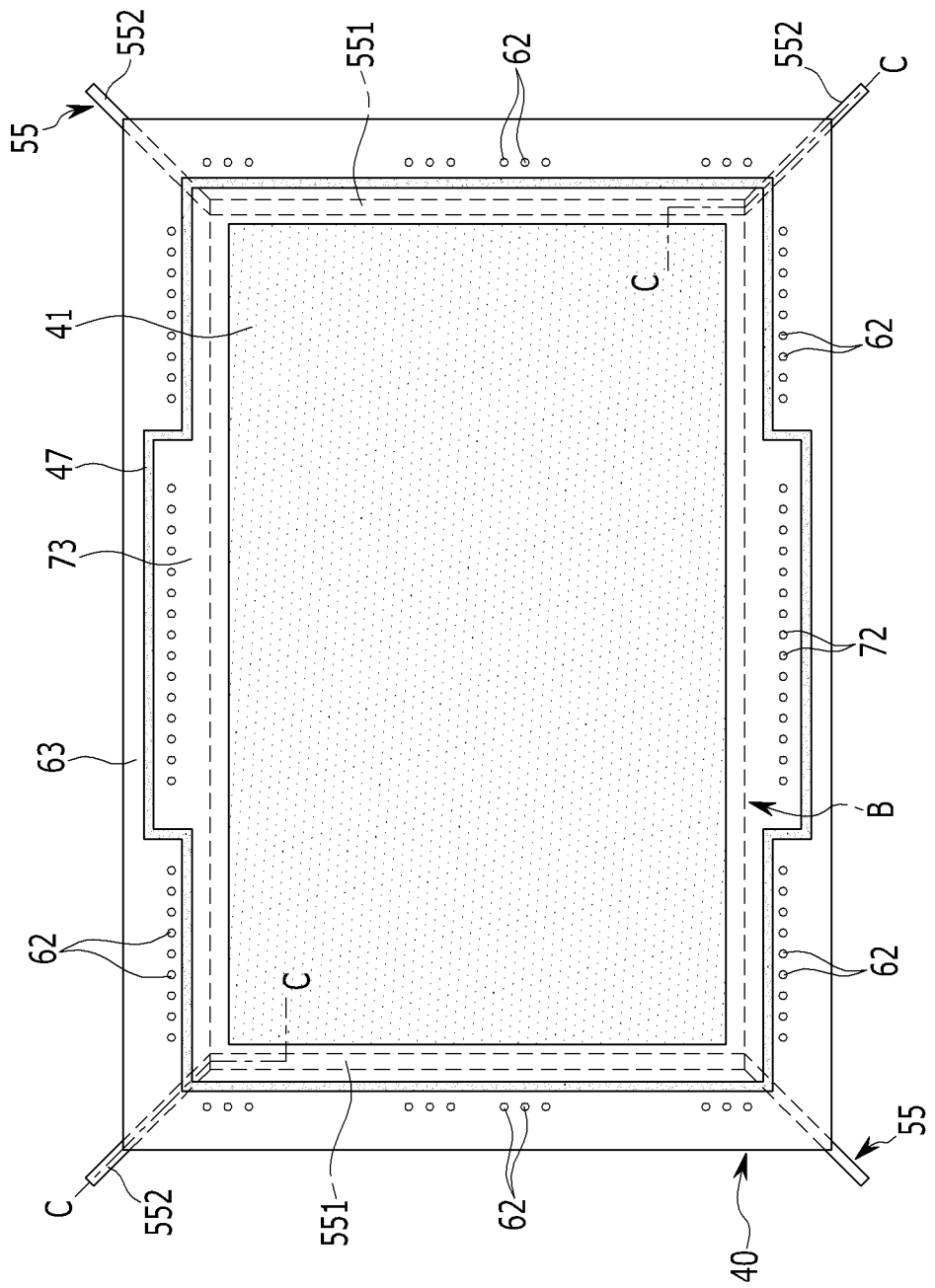
FIG. 15 is a top plan view showing the outer side of the sealing substrate in the embodiment of an organic light emitting diode display shown in FIG. 13.
Figure 16:
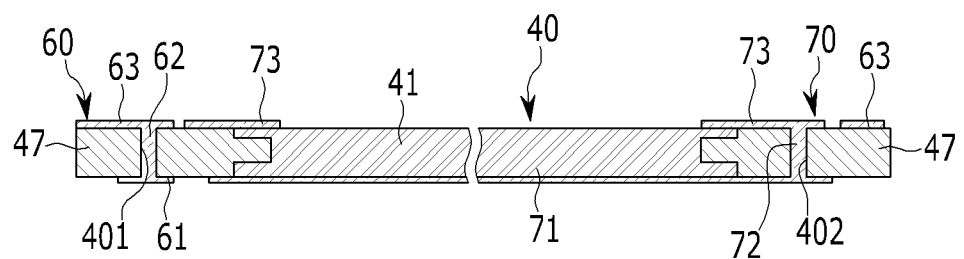
FIG. 16 is a cross-sectional view taken along the line A-A of FIG. 14.

The display device 100 having the configuration described above may be an organic light emitting diode display. FIG. 13 is a cross-sectional view schematically showing an embodiment of an organic light emitting diode display, FIGS. 14 and 15 are top plan views showing the inner side and the outer side of a sealing substrate in the embodiment of an organic light emitting diode display shown in FIG. 13, and FIG. 16 is a cross-sectional view taken along the line A-A of FIG. 14.

Referring to FIG. 13, an embodiment of an organic light emitting diode display 200 includes a substrate 10, a display unit 20 formed on the substrate 10, and a sealing substrate 40 fixed to the substrate 10 by bonding layers 33 and 34 surrounding the display unit 20. A hygroscopic filler and a getter, which are not shown, are positioned between the substrate 10 and the sealing substrate 40, inside the bonding layer 33.

The display unit 20 includes a plurality of pixels, and an organic light emitting diode, a driving circuit, a gate line, a data line, and a common power line 21 are disposed in each of the pixels. The organic light emitting diode includes a pixel electrode, an organic emission layer, and a common electrode 22 and the driving circuit includes at least two thin film transistors, including a switching thin film transistor and a driving thin film transistor, and at least one capacitor.

The gate line transmits scan signals, the data line transmits data signals, and the common power line 21 applies common voltage to the driving thin film transistor. The common power line 21 may include a first common power line and a second common power line, which may be perpendicular to each other. FIG. 13 schematically shows the display unit 20 including the common power line 21 and the common electrode 22.

A first pad 23 electrically connected with the common power line 21 and a second pad 24 electrically connected with the common electrode 22 are disposed on the substrate 10, outside the display unit 20. FIG. 13 schematically shows the common power line 21 and the common electrode 22 extending outside the display unit 20 and forming the first pad 23 and the second pad 24, respectively. In other embodiments, the first pad 23 and the second pad 24 may be alternately disposed in the transverse direction and the vertical direction of the substrate 10.

A first bonding layer 33 surrounds the display unit 20 and a second bonding layer 34 surrounds the first bonding layer 33, outside the first bonding layer 33. Further, a conductive bonding layer 35 is positioned between the first bonding layer 33 and the second bonding layer 34. The conductive bonding layer 35 is made of thermosetting resin containing conductive components and overlaps the first pad 23 and the second pad 24.

The conductive bonding layer 35 is conductive in the thickness direction and is not conductive in the other directions. Therefore, the first pad 23 and the second pad 24 are not short-circuited, even if one conductive bonding layer 35 is in contact with both the first pad 23 and the second pad 24.

Referring to FIG. 13 to FIG. 16, the sealing substrate 40 has a first penetration hole 401 for applying electric signals of the common power line 21 and a second penetration hole 402 for applying electric signals of the common electrode 22. Further, a first conductive part 60 is formed throughout the inner side of the sealing substrate 40, the first penetration hole 401, and the outer side of the sealing substrate 40, while a second conductive part 70 is formed throughout the inner side of the sealing substrate 40, the second penetration hole 402, and the outer side of the sealing substrate 40.

The sealing substrate 40 is composed of a composite member 41 including a resin matrix and a plurality of carbon fibers, and an insulating member 47 coupled to the edge of the composite member 41. The first penetration hole 401 and the second penetration hole 402 are formed through the insulating member 47. The line B shown by dotted lines in FIG. 14 and FIG. 15 indicates a boundary line between the composite member 41 and the insulating member 47.

The first conductive part 60 is formed at the insulating member 47, while the second conductive part 70 is formed at the composite member 41 and the insulating member 47. The second conductive part 70 is in contact with the composite member 41, such that electricity is transmitted between the composite member 41 and the second conductive part 70, whereas since the first conductive part 60 is positioned at a predetermined distance from the second conductive part 70 on the insulating member 47, the first conductive part 60 and the second conductive part 70 are not short-circuited.

The first conductive part 60 includes a first inner layer 61 formed on the inner side of the insulating member 47, a first connection part 62 being in contact with the first inner layers 61 and inserted in the first penetration hole 401, and a first outer layer 63 being in contact with the first connection part 62 and formed on the outer side of the insulating member 47. The first inner layer 61 is in contact with the conductive bonding layer 35 and electrically connected with the first pad 23 on the substrate 10.

The second conductive part 70 includes a second inner layer 71 formed across the inner side of the composite member 41 and the inner side of the insulating member 47, a second connection part 72 being in contact with the second inner layer 71 and inserted in the second penetration hole 402, and a second outer layer 73 being in contact with the second connection part 72 and formed on the outer side of the insulating member 47. The second inner layer 71 is composed of a center part 711 being in contact with the composite member 41 (see FIG. 14) and extending parts 712 (see FIG. 14) being in contact with the insulating member 47. The extending parts 712 are electrically connected with the second pad 24 on the substrate 10, in contact with the conductive bonding layer 35.

The center part 711 of the second inner layer 71 is sized such that it covers the entire display unit 20 while being in contact with the first bonding layer 33. The second inner layer 71, which is the same as the metal layer 42 of the display device 100 shown in FIG. 1, and not only performs metal encapsulation that prevents external water and oxygen from penetrating, but functions as a wire layer transmitting electric signals to the common electrode 22.

The first outer layer 63 is positioned at the outer edge of the insulating member 47 and the second outer layer 73 is positioned at a predetermined distance from the first outer layer 63, inside the first outer layer 63. In some embodiments, the first outer layer 63 and the second outer layer 73 both may be formed in a rectangular frame shape.

External connection terminals (not shown) are attached to the first outer layer 63 and the second outer layer 73. Therefore, the first outer layer 63 receives a first electric signal of the common power line 21 from the external connection terminal and transmits it to the first inner layer 61 and the second outer layer 73 receives a second electric signal of the common electrode 22 from the external connection terminal and transmits it to the second inner layer 71.

According to the configuration described above, it is possible to uniformly apply corresponding electric signals to the common power line 21 and the common electrode 22, without forming pad regions around the up/down and left right four edges of the substrate 10 while implementing the display unit 20 having a large area. As a result, it is possible to prevent non-uniformity in luminance due to manufacturing the display unit 20 having a large area and simplify the entire structure and the manufacturing process of the organic light emitting diode display 200.

Figure 17:
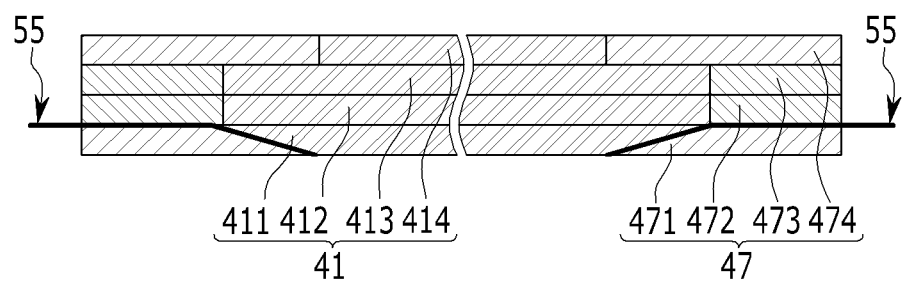
FIG. 17 is a cross-sectional view taken along the line C-C of FIG. 15.
Figure 18:
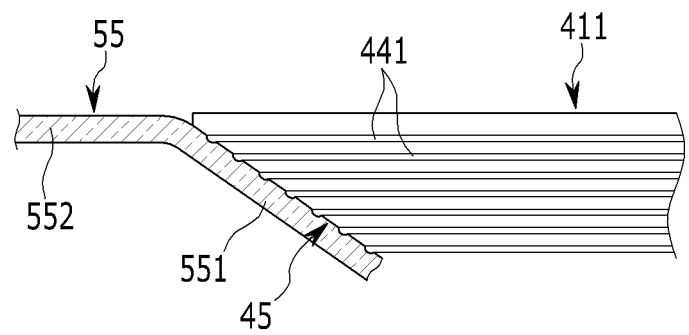
FIG. 18 is a partial enlarged cross-sectional view of FIG. 17.

FIG. 17 is a cross-sectional view taken along the line C-C of FIG. 15 and FIG. 18 is a partial enlarged cross-sectional view of FIG. 17.

Referring to FIG. 17 and FIG. 18, the composite member 41 has a structure formed by stacking a first composite layer 411, a second composite layer 412, a third composite layer 413, and a fourth composite layer 414, in which each of the composite layers 411-414 includes a resin matrix and a plurality of carbon fibers. The carbon fibers of the first composite layer 411 and the carbon fiber of the fourth composite layer 414 are arranged in a first direction, and the carbon fibers of the second composite layer 412 and the carbon fibers of the third composite layers 413 are arranged in a second direction perpendicular to the first direction.

The insulating member 47 has a structure formed by stacking a first insulation layer 471, a second insulation layer 472, a third insulation layer 473, and a fourth insulation layer 474. The first insulation layer 471 to the fourth insulation layer 474 are each in contact with the sides of the first composite layer 411 to the fourth composite layer 414. The first insulation layer 471 to the fourth insulation layer 474 may be made of polymer resin, such as polyethylene terephthalate (PET), or a reinforced fiber composite material.

The reinforced fiber composite material includes a resin matrix and a plurality of reinforced fibers and the reinforced fiber may be glass fiber or aramid fiber. The reinforced fiber of the first insulation layer 471 and the reinforced fiber of the fourth insulation layer 474 are arranged in the first direction, while the reinforced fiber of the second insulation layer 472 and the reinforced fiber of the third insulation layer 473 are arranged in the second direction, perpendicular to the first direction.

Terminals 45 are formed at both ends of the first composite layer 411 in the first direction and expose the ends of the carbon fibers 441. The terminals 45 may have inclining surfaces facing down to the substrate 10. The first composite layer 411 to the fourth composite layer 414 are stacked and conductive members 55 are attached to the terminals 454 of the first composite layer 411.

The conductive member 55 is composed of a contact part 551 fixed to the terminals 45, in contact with the carbon fibers 441, and an extending part 552 passing through the insulating member 47 and extending outside the insulating member 47, in contact with the contact part 551. The conductive member 55 may be a thin copper plate. FIG. 15 shows the plan view of the conductive member 55.

The first insulation layer 471 to the fourth insulation layer 474 are stacked at the edges of first composite layer 411 to the fourth composite layer 414. The extending part 552 is positioned between the first insulation layer 471 and the second insulation layer 472, with the ends exposed outside the first and second insulation layers 471 and 472. The first composite layer 411 to the fourth composite layer 414 and the first insulation layer 471 to the fourth insulation layer 474 make a single sealing substrate 40 by integrally hardening the resin matrixes, using plastic working.

The extending part 552 exposed outside the insulating member 47 is fitted to a connection electrode (not shown) in manufacturing the organic light emitting diode display 100 to receive electricity from the connection electrode, and transmits the supplied electricity to the carbon fibers 441 of the composite member 41. Accordingly, the composite member 41 emits heat due to the resistance heat of the carbon fibers 441 and hardens the first and second bonding layers 33 and 34 and the conductive bonding layer 35.

In other embodiments, the position of the terminals 45 and the position of the conductive member 55 fitted to the insulating member 47 may be changed.

Further, although it was described with reference to FIGS. 13 and 16 that the composite member 41 and the insulating member 47 have a protrusion-hole coupling structure which is symmetric in the thickness direction of the sealing substrate 40, the shape of the interface between the composite member 41 and the insulating member 47 is not limited to that shown in the figures. The protrusion-hole coupling structure of the composite member 41 and the insulating member 47 is for increasing the bonding force of the two members 41 and 47 by increasing the contact area between the composite member 41 and the insulating member 47.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a substrate;
a display unit formed on the substrate;
a bonding layer disposed outside the display unit and including thermosetting resin; and
a sealing substrate fixed to the substrate by the bonding layer,
wherein the sealing substrate comprises:
a composite member comprising a resin matrix and a plurality of carbon fibers, the composite member composed of a plurality of layers;
a terminal formed at an end in at least one direction of the composite member and exposing the ends of the carbon fibers, wherein the terminal is an inclining surface formed by cutting off at an angle at least one side of at least one of the plurality of layers of the composite member; and
a metal layer disposed on a side of the composite member which faces the display unit.

2. The display device of claim 1, wherein:
each of the plurality of layers comprises a resin matrix and a plurality of carbon fibers arranged in one direction, and the carbon fibers disposed on any one of the plurality of layers intersect the carbon fibers disposed on another layer.

3. The display device of claim 2, wherein:
the composite member comprises first to fourth composite layers, the carbon fibers in the first and fourth composite layers are arranged in a first direction, and the carbon fibers in the second and third composite layers are arranged in a second direction perpendicular to the first direction.

4. The display device of claim 3, wherein:
the terminal is formed at both ends of the first composite layer in the first direction.

5. The display device of claim 4, wherein:
the terminal is an inclining surface formed by cutting off at an angle at least one of a side of a corresponding composite layer which faces the substrate and the opposite side.

6. The display device of claim 3, wherein:
the terminal is formed at both ends of the first composite layer in the first direction and at both ends of the fourth composite layer in the first direction.

7. The display device of claim 6, wherein:
the terminal is an inclining surface formed by cutting off at an angle at least one of a side of a corresponding composite layer which faces the substrate and the opposite side.

8. The display device of claim 3, wherein:
the terminal is formed at both ends of the first composite layer in the first direction, at both ends of the second composite layer in the second direction, at both ends of the third composite layer in the second direction, and at both ends of the fourth composite layer in the first direction.

9. The display device of claim 8, wherein:
the terminal is an inclining surface formed by cutting off at an angle at least one of a side of a corresponding composite layer which faces the substrate and the opposite side.

10. The display device of claim 1, further comprising:
a hygroscopic filler positioned between the substrate and the sealing substrate, inside the bonding layer, and a getter disposed inside the bonding layer.

11. The organic light emitting diode display of claim 10, wherein:
the first conductive part comprises:
a first inner layer disposed on the inner side of the insulating member, in contact with the conductive bonding layer;
a first outer layer disposed on the outer side of the insulating member; and
a first connection part inserted in the first penetration hole and connecting the first inner layer with the first outer layer.

12. The organic light emitting diode display of claim 11, wherein:
the second conductive part comprises:
a second inner layer disposed across the inner side of the composite member and the inner side of the insulating member, in contact with the conductive bonding layer;
a second outer layer disposed on the outer side of the insulating member; and
a second connection part inserted in the second penetration hole and connecting the second inner layer with the second outer layer.

13. The organic light emitting diode display of claim 12, wherein:
the first inner layer and the second inner layer are separated from each other by an interval, and the first outer layer and the second outer layer are separated from each other by an interval.

14. An organic light emitting diode display comprising:
a substrate;
a display unit formed on the substrate and comprising a common power line and a common electrode;
a bonding layer disposed outside the display unit and comprising thermosetting resin;
a sealing substrate fixed to the substrate by the bonding layer, and comprising:
a composite member that comprises a resin matrix and a plurality of carbon fibers, the composite member composed of a plurality of layers, and
an insulating member that is coupled to the edge of the composite member, the insulating member having a first penetration hole and a second penetration hole;
a first conductive part formed throughout the inner side and the outer side of the sealing substrate through the first penetration hole and supplying a first electric signal to the common power line; and
a second conductive part formed throughout the inner side and the outer side of the sealing substrate through the second penetration hole and supplying a second electric signal to the common electrode,
wherein the composite member has a terminal exposing the ends of the carbon fibers, at one end in at least one direction, wherein the terminal is an inclining surface formed by cutting off at an angle at least one side of at least one of the plurality of layers of the composite member.

15. The organic light emitting diode display of claim 14, wherein:
the common power line is connected with a first pad outside the display unit and the common electrode is connected with a second pad outside the display unit, and
a conductive bonding layer is positioned between the first pad and the first conductive part and between the second pad and the second conductive part.

16. The organic light emitting diode display of claim 15, wherein:
the conductive bonding layer is positioned at a predetermined distance from the bonding layer, comprises thermosetting resin, and is nonconductive in directions other than a thickness direction.

17. The organic light emitting diode display of claim 14, wherein:
the composite member comprises first to fourth composite layers, the carbon fibers in the first and fourth composite layers are arranged in a first direction, and the carbon fibers in the second and third composite layers are arranged in a second direction perpendicular to the first direction.

18. The organic light emitting diode display of claim 17, wherein:
the terminal is formed at both ends of any one of the first to fourth composite layers.

19. The organic light emitting diode display of claim 18, wherein:
the sealing substrate further comprises a conductive member, and
the conductive member comprises a contact part fixed to the terminal, in contact with the ends of the carbon fibers, and an extending part passing through the insulating member and exposed outside the insulating member.

20. The organic light emitting diode display of claim 19, wherein:
the insulating member comprises first to fourth insulating layers and each of the first to fourth insulating layers is made of any one of polymer resin and a reinforced fiber composite material, and
the extending part passes through between two adjacent insulating layers in the first to fourth insulating layers, and exposed outside the insulating member.

* * * * *